(12) United States Patent
Lee et al.

(10) Patent No.: US 10,847,751 B2
(45) Date of Patent: Nov. 24, 2020

(54) DISPLAY DEVICE INCLUDING A THIN FILM ENCAPSULATING LAYER AND METHOD OF MANUFACTURING THE SAME

(71) Applicant: SAMSUNG DISPLAY CO., LTD., Yongin-si (KR)

(72) Inventors: Dong-hyun Lee, Suwon-si (KR); Deukjong Kim, Cheonan-si (KR); Yanghee Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/236,691

(22) Filed: Dec. 31, 2018

(65) Prior Publication Data

US 2019/0207161 A1 Jul. 4, 2019

(30) Foreign Application Priority Data

Jan. 3, 2018 (KR) ........................ 10-2018-0000847

(51) Int. Cl.
*H01L 51/52* (2006.01)
*H01L 51/56* (2006.01)
*H01L 27/32* (2006.01)

(52) U.S. Cl.
CPC ...... *H01L 51/5256* (2013.01); *H01L 51/5246* (2013.01); *H01L 51/56* (2013.01); *H01L 27/3246* (2013.01); *H01L 27/3276* (2013.01)

(58) Field of Classification Search
CPC . H01L 51/5256; H01L 51/5246; H01L 51/56; H01L 27/3246; H01L 27/3276; H01L 27/32–3274; H01L 27/3241–3297; H01L 51/0508–057
See application file for complete search history.

(56) References Cited

U.S. PATENT DOCUMENTS

| | | | |
|---|---|---|---|
| 7,928,656 B2 | 4/2011 | Imamura | |
| 9,093,651 B2 | 7/2015 | Lee et al. | |
| 9,450,212 B2 | 9/2016 | Oh | |
| 2019/0013373 A1 | 1/2019 | Lee et al. | |
| 2019/0348476 A1* | 11/2019 | Kato | ..................... H01L 27/323 |

FOREIGN PATENT DOCUMENTS

| | | |
|---|---|---|
| KR | 10-0576639 | 4/2006 |
| KR | 10-2015-0026356 | 3/2015 |
| KR | 10-2019-0006150 | 1/2019 |

* cited by examiner

*Primary Examiner* — Cuong B Nguyen
(74) *Attorney, Agent, or Firm* — F. Chau & Associates, LLC

(57) ABSTRACT

A display device includes a base layer including a display area, a non-display area, and a pad area. The display device further includes a circuit layer disposed on the base layer and including a plurality of insulating layers and a plurality of conductive layers. The display device additionally includes a light emitting element layer disposed on the circuit layer, and a thin film encapsulating layer disposed on the light emitting element layer. An edge of the thin film encapsulating layer disposed between the display area and the pad area includes a first edge and a second edge, and the first edge is disposed on an insulating layer among the plurality of insulating layers. The insulating layer includes an inorganic material.

10 Claims, 13 Drawing Sheets

DISPLAY DEVICE INCLUDING A THIN FILM ENCAPSULATING LAYER AND METHOD OF MANUFACTURING THE SAME

CROSS-REFERENCE TO RELATED APPLICATION

This U.S. non-provisional patent application claims priority under 35 U.S.C. § 119 of Korean Patent Application No. 10-2018-0000847, filed on Jan. 3, 2018, disclosure of which is incorporated by reference herein in its entirety.

TECHNICAL FIELD

The present inventive concept relates to a display device, and more particularly, to a display device including a thin film encapsulating layer and a method of manufacturing the same.

DISCUSSION OF THE RELATED ART

A light emitting layer of an organic light emitting display device may include an organic material. To protect the organic material from oxygen and moisture, various techniques for encapsulating an organic light emitting element are being developed. Among such techniques, a thin film encapsulation technique is a technique in which a thin film encapsulating layer is disposed on an organic light emitting element to block air, moisture, and the like from penetrating to the organic light emitting element. The thin film encapsulating layer may include an inorganic layer, which includes an inorganic material, and an organic layer, which includes an organic material, alternatively laminated.

SUMMARY

According to an exemplary embodiment of the present inventive concept, a display device includes a base layer including a display area, a non-display area, and a pad area. The display device further includes a circuit layer disposed on the base layer and including a plurality of insulating layers and a plurality of conductive layers. The display device additionally includes a light emitting element layer disposed on the circuit layer, and a thin film encapsulating layer disposed on the light emitting element layer. An edge of the thin film encapsulating layer disposed between the display area and the pad area includes a first edge and a second edge, and the first edge is disposed on an insulating layer among the plurality of insulating layers. The insulating layer includes an inorganic material.

In an exemplary embodiment of the present inventive concept, the circuit layer includes a first insulating layer disposed on the base layer, a first conductive layer disposed on the first insulating layer, a second insulating layer disposed on the first conductive layer, a second conductive layer disposed on the second insulating layer, a third insulating layer disposed on the second conductive layer and including the inorganic material, and a fourth insulating layer disposed on the third insulating layer and including an organic material, and an opening. The opening exposes the third insulating layer, and the first edge is disposed on the third insulating layer and overlaps the opening.

In an exemplary embodiment of the present inventive concept, the opening includes a first opening area overlapping the second conductive layer, and a second opening area overlapping an area adjacent the second conductive layer. The first edge is disposed in the second opening area.

In an exemplary embodiment of the present inventive concept, the second edge is disposed in the first opening area, and is disposed on the third insulating layer.

In an exemplary embodiment of the present inventive concept, between the second edge and the second conductive layer, the third insulating layer and the fourth insulating layer are disposed.

In an exemplary embodiment of the present inventive concept, the first opening area and the second opening area are arranged along a first direction, and a first width of the first opening area in a second direction crossing the first direction is smaller than a second width of the second opening area in the second direction.

In an exemplary embodiment of the present inventive concept, the first opening area and the second opening area are arranged along a first direction, and a first width of the first opening area in a second direction crossing the first direction is the same as a second width of the second opening area in the second direction.

In an exemplary embodiment of the present inventive concept, a distance between the first edge and the display area is substantially the same as a distance between the second edge and the display area in a plane view.

In an exemplary embodiment of the present inventive concept, a distance between the second edge and the display area is greater than a distance between the first edge and the display area in a plane view.

In an exemplary embodiment of the present inventive concept, the second conductive layer includes a first power supply electrode for providing a first power supply voltage, and a second power supply electrode for providing a second power supply voltage different from the first power supply voltage.

In an exemplary embodiment of the present inventive concept, the circuit layer includes a first insulating layer disposed on the base layer, a first conductive layer disposed on the first insulating layer, a second insulating layer disposed on the first conductive layer, a second conductive layer disposed on the second insulating layer, a third insulating layer disposed on the second insulating layer and covering the second conductive layer, and a fourth insulating layer disposed on the third insulating layer and including an organic material. An opening penetrates the third insulating layer and the fourth insulating layer, and the second conductive layer or the second insulating layer are exposed by the opening. The first edge is disposed on the second insulating layer.

In an exemplary embodiment of the present inventive concept, the thin film encapsulating layer includes at least one organic layer, a first inorganic layer and a second inorganic layer. The organic layer is disposed between the first and second inorganic layers, and the edge of the thin film encapsulating layer is an edge of the first and second inorganic layers.

According to an exemplary embodiment of the present inventive concept, a method of manufacturing a display device, includes disposing a base layer including a display area, a non-display area, and a pad area. The method further includes forming a circuit layer on the base layer, the circuit layer including a plurality of insulating layers and a plurality of conductive layer, forming a light emitting element layer on the circuit layer, disposing a mask having a mask opening on the light emitting element layer, and forming a first inorganic layer using the mask. The first inorganic layer covers the light emitting element layer. The method additionally includes forming an organic layer on the first inorganic layer, and forming a second inorganic layer on the organic layer. An opening for exposing an insulating layer of the plurality of insulating layers disposed between the display area and the pad area and including an inorganic material is provided, and the mask is disposed such that an edge of the mask including the mask opening and the opening overlap each other.

In an exemplary embodiment of the present inventive concept, the forming of the circuit layer includes forming a first insulating layer on the base layer, forming a first conductive layer on the first insulating layer, forming a second insulating layer on the first conductive layer, forming a second conductive layer on the second insulating layer, forming a third insulating layer on the second conductive layer. The third insulating layer includes the inorganic material, and forming a fourth insulating layer on the third insulating layer. The fourth insulating layer includes an organic material. The method further includes removing a portion of the fourth insulating layer to provide the opening for exposing the third insulating layer.

In an exemplary embodiment of the present inventive concept, the opening includes a first opening area overlapping the second conductive layer and a second opening area not overlapping the second conductive layer, and the edge of the mask includes a first mask edge not overlapping the first opening area and a second mask edge overlapping the second opening area.

In an exemplary embodiment of the present inventive concept, the first mask edge and the second mask edge are disposed on a line extending in a first direction.

In an exemplary embodiment of the present inventive concept, the first opening area and the second opening area are arranged along the first direction, and a first width of the first opening area in a second direction crossing the first direction is less than a second width of the second opening area in the second direction.

In an exemplary embodiment of the present inventive concept, the first opening area and the second opening area are arranged along a first direction, and a first width of the first opening area in a second direction crossing the first direction is substantially the same as a second width of the second opening area in the second direction.

In an exemplary embodiment of the present inventive concept, a width of the mask opening extending to the first mask edge in the second direction is greater than a width of the mask opening extending to the second mask edge in the second direction.

In an exemplary embodiment of the present inventive concept, in the forming of the first inorganic layer, an edge of the first inorganic layer is disposed on the third insulating layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein.

DETAILED DESCRIPTION OF THE EMBODIMENTS

Figure 1:
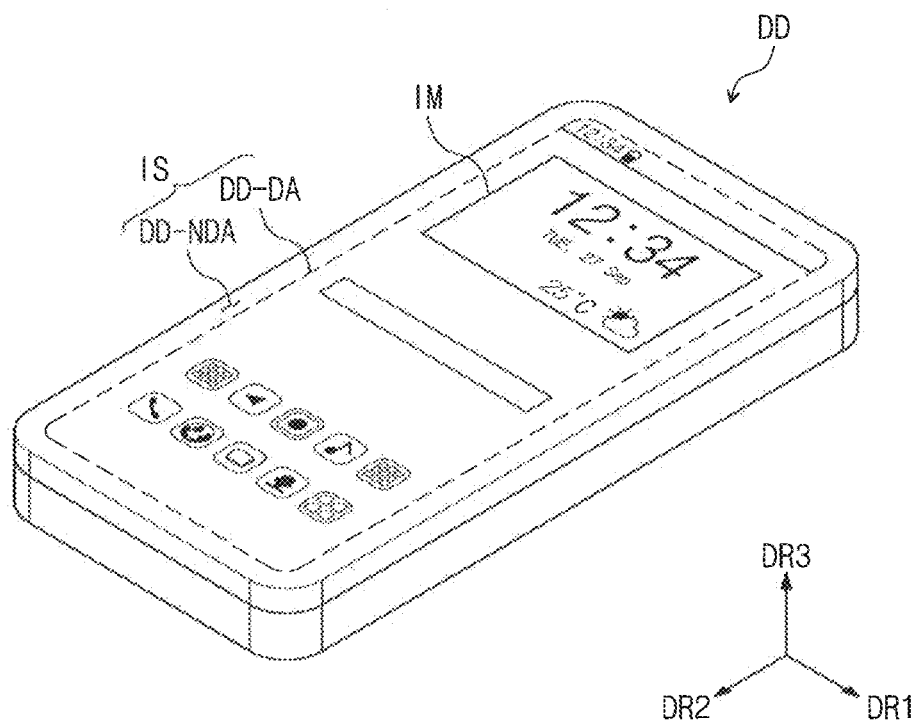
FIG. 1 is a perspective view of a display device according to an exemplary embodiment of the present inventive concept.

Hereinafter, exemplary embodiments of the present inventive concept will be described in detail with reference to the accompanying drawings. In the present disclosure, when an element (or a region, a layer, a section, etc.) is referred to as being "on," "connected to," or "coupled to" another element, it may be directly connected/coupled to the other element, or an intervening element may be disposed therebetween.

Like reference numerals may refer to like elements throughout the specification and figures. In addition, in the accompanying drawings, the thickness, ratio, and dimensions of the elements may be exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of present inventive concept.

FIG. 1 is a perspective view of a display device DD according to an exemplary embodiment of the present inventive concept.

Referring to FIG. 1, the display device DD may display an image IM through a display surface IS. In FIG. 1, as an example of the image IM, application icons are illustrated. In FIG. 1, for example, the display surface IS is a surface extending in a first direction DR1 and a second direction DR2 crossing the first direction DR1. For example, the display surface IS may be flat. However, in an exemplary embodiment of the present inventive concept, a display surface of a display device may have a curved shape.

A normal direction of the display surface IS (e.g., 90 degree with respect to the display surface IS), that is, the thickness direction of the display device DD is indicated by a third direction DR3. The directions indicated by the first to third directions DR1, DR2, and DR3 are a relative concept, and therefore, may be converted to other coordinate systems.

In FIG. 1, the display device DD may, for example, be a portable electronic device. However, the display device DD may be used for relatively large electronic devices such as a television, a monitor, or an external advertisement board, and also for small and medium-sized electronic devices, such as a personal computer, a notebook computer, a personal digital terminal, a car navigation system unit, a game machine (e.g., a portable gaming device), a smart phone, a tablet, and a camera. It should be understood that these are merely examples, and the display device DD may be employed in other electronic devices without departing from spirit and scope of the present inventive concept.

The display surface IS includes a display area DD-DA on which the image IM is displayed, and a non-display area DD-NDA adjacent to the display area DD-DA. The non-display area DD-NDA is a region on which an image might not be displayed. As an example, the display area DD-DA may be square-shaped. The non-display area DD-NDA may at least partially surround the display area DD-DA, but the present inventive concept is not limited thereto. For example, the non-display area DD-NDA may fully surround the display area DD-DA. As an additional example, a shape of the non-display area DD-NDA may correspond to a shape of a boundary of the display area DD-DA.

Figure 2:
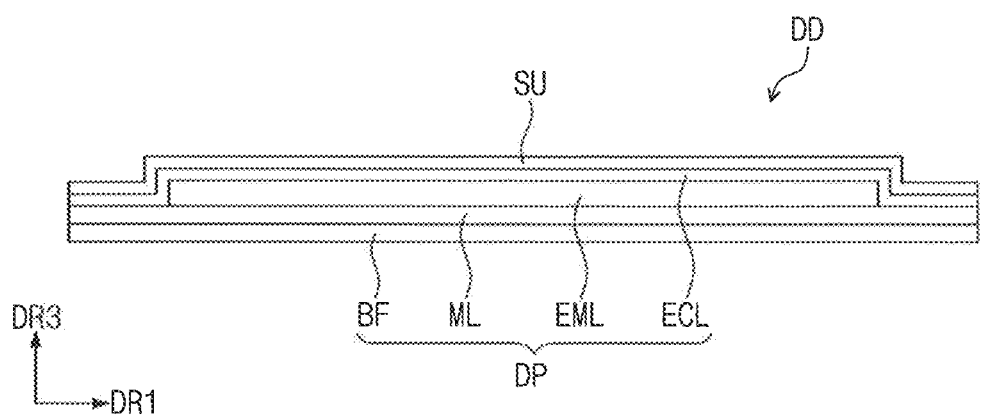
FIG. 2 is a schematic cross-sectional view of a display device according to an exemplary embodiment of the present inventive concept.
Figure 3:
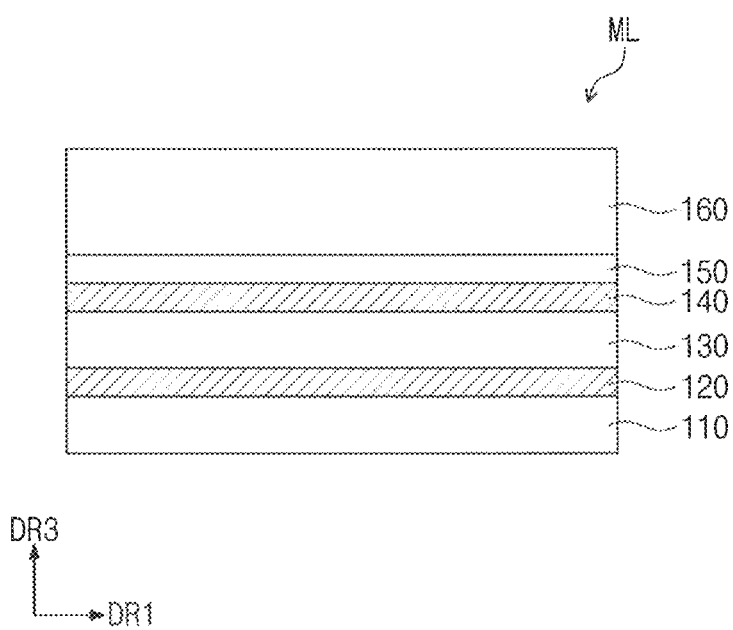
FIG. 3 is a cross-sectional view illustrating a portion of a circuit layer according to an exemplary embodiment of the present inventive concept.

FIG. 2 is a schematic cross-sectional view of a display device according to an exemplary embodiment of the present inventive concept, and FIG. 3 is a cross-sectional view illustrating a portion of a circuit layer according to an exemplary embodiment of the present inventive concept.

Referring to FIGS. 2 and 3, the display device DD may include a display panel DP and a sensing unit SU.

The display panel DP includes a base layer BF, a circuit layer ML, a light emitting element layer EML, and a thin film encapsulating layer ECL. In the present disclosure, as an example of the display panel DP, an organic light emitting display panel is described. However, the present inventive concept is not limited thereto.

The base layer BF may be a silicon substrate, a plastic substrate, a glass substrate, an insulation film, or a laminated structure including a plurality of insulating layers.

The circuit layer ML may be disposed on the base layer BF. The circuit layer ML may include a plurality of insulating layers, a plurality of conductive layers, and a semiconductor layer.

Referring to FIG. 3, the circuit layer ML may include a first insulating layer 110, a first conductive layer 120, a second insulating layer 130, a second conductive layer 140, a third insulating layer 150, and a fourth insulating layer 160. However, the present inventive concept is not limited thereto, and the circuit layer ML may further include other layers besides the layers illustrated in FIG. 3.

Each of the first conductive layer 120 and the second conductive layer 140 may include signal lines or electrodes of a transistor. For example, the first conductive layer 120 may be used to refer to all of the conductive patterns disposed between the first insulating layer 110 and the second insulating layer 130, and the second conductive layer 140 may be used to refer to all of the conductive patterns disposed between the second insulating layer 130 and the third insulating layer 150. Therefore, the second insulating layer 130 may be disposed on the first insulating layer 110 and may cover the first conductive layer 120, and the third insulating layer 150 may be disposed on the second insulating layer 130 and may cover the second conductive layer 140.

The light emitting element layer EML may be disposed on the circuit layer ML. The light emitting element layer EML may include a display element, for example, organic light emitting diodes. However, the present inventive concept is not limited thereto, and according to a type of the display panel DP, the light emitting element layer EML may include inorganic light emitting diodes or organic-inorganic hybrid light emitting diodes.

The thin film encapsulating layer ECL encloses and seals the light emitting element layer EML. The thin film encapsulating layer ECL includes a plurality of inorganic layers and at least one organic layer disposed therebetween. The inorganic layers protect the light emitting element layer EML from moisture and oxygen, and the organic layer protects the light emitting element layer EML from a foreign material such as a dust particle.

In addition, the thin film encapsulating layer ECL may further include a buffer layer. The buffer layer may be a layer most adjacent to the sensing unit SU. The buffer layer may be an inorganic layer or an organic layer. The inorganic layer may include of silicon nitride, silicon oxynitride, silicon oxide, titanium oxide, and/or aluminum oxide. The organic layer may include a polymer, such as an acryl-based organic layer. However, the present inventive concept is not limited thereto.

The sensing unit SU may include a circuit for detecting a touch input. A touch detection method of the sensing unit SU includes a resistance film type, an optical type, an electrostatic capacity type, and an ultrasound type, but the present inventive concept is not limited thereto. Among the methods, the sensing unit SU of an electrostatic capacity type may detect whether or not touch is generated or not by using an electrostatic capacity which changes when a touch generating means contacts a screen of the display device DD. The electrostatic capacity type may be classified into a mutual capacitance type and a self-capacitance type.

The sensing unit SU may be directly disposed on the display panel DP. However, the present inventive concept is not limited thereto. The display panel DP and the sensing unit SU may be coupled to each other by an adhesive member.

Figure 4:
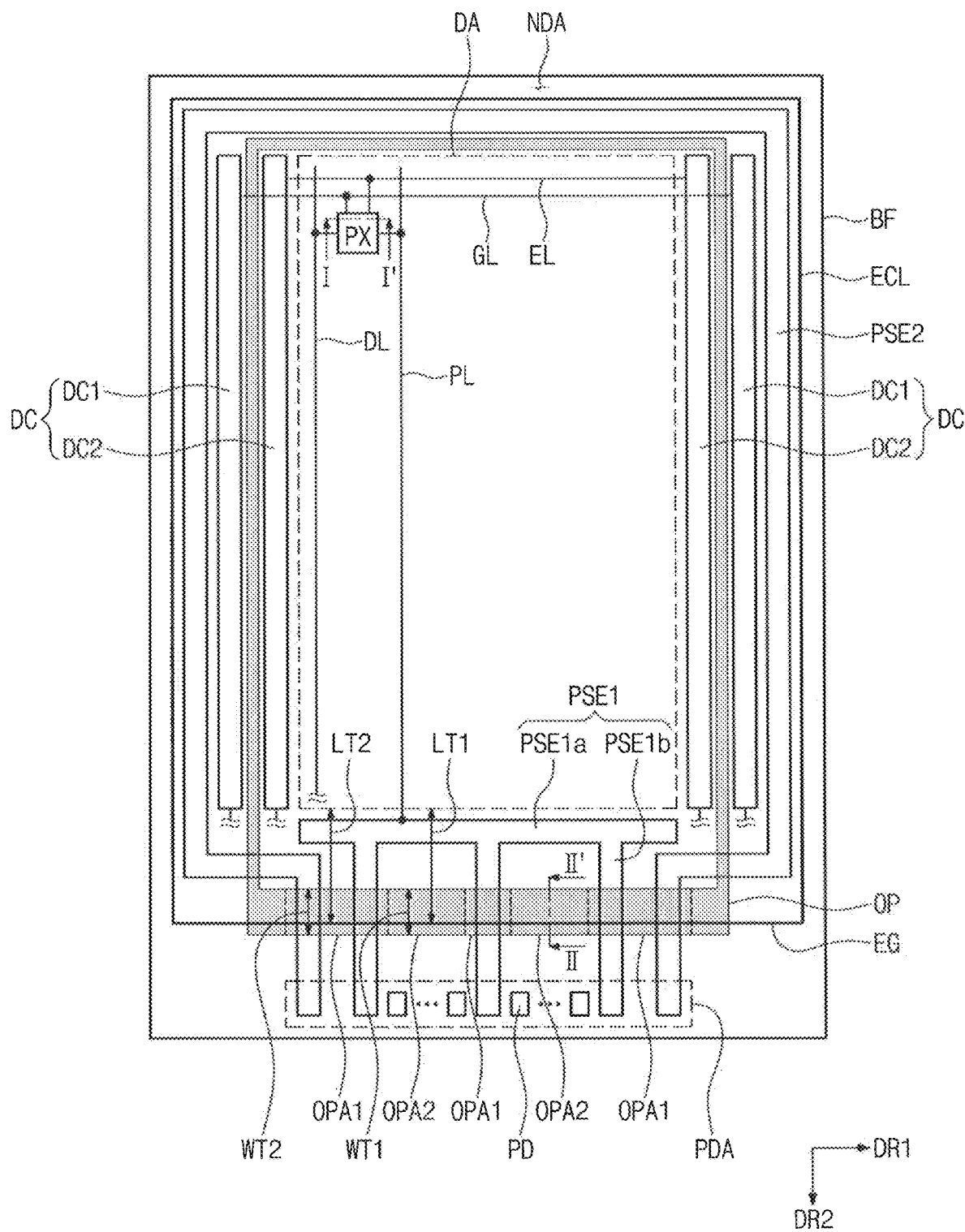
FIG. 4 is a plan view of a display device according to an exemplary embodiment of the present inventive concept.

FIG. 4 is a plan view of a display device according to an exemplary embodiment of the present inventive concept.

Referring to FIG. 4, a display area DA, a non-display area NDA, and a pad area PDA may be provided on the base layer BF. The display area DA of the base layer BF may correspond to the display area DD-DA of the display device DD of FIG. 1, and the non-display area NDA and the pad area PDA of the base layer BF may correspond to the non-display area DD-NDA of the display device DD of FIG. 1. However, the configurations might not be the same, and may be changed according to the structure/design of the display panel DP. For example, the pad area PDA may be provided on the base layer BF where the non-display area NDA is the largest.

The circuit layer ML (See FIG. 2) may include data lines DL, gate lines GL, light emission control lines EL, power supply lines PL, driving circuits DC, a first power supply electrode PSE1, a second power supply electrode PSE2, and pads PD. Each of the gate lines GL, the light emission control lines EL, and data lines DL may be electrically connected to a corresponding pixel among pixels PX.

For example, the driving circuits DC may be disposed in the non-display area NDA. In FIG. 4, the driving circuits DC are disposed in regions facing each other with the display area DA disposed therebetween. For example, the driving circuits DC are disposed on opposite sides of the non-display area NDA. However, the present inventive concept is not limited thereto. One of the driving circuits DC may be omitted so that a driving circuit may be disposed only on one side of the non-display area NDA.

Each of the driving circuits DC may include a first driving circuit DC1 and a second driving circuit DC2. On a plane, the second driving circuit DC2 may be disposed between the first driving circuit DC1 and the display area DA. The first driving circuit DC1 may be electrically connected to the gate lines GL, and the second driving circuit DC2 may be electrically connected to the light emission control lines EL. The first and second driving circuits DC1 and DC2 may include a plurality of thin film transistors provided through the same process as a driving circuit of the pixel PX.

The first driving circuit DC1 may generate scan signals and output the generated scan signals to the gate lines GL, and the second driving circuit DC2 may generate light emission control signals and output the generated light emission control signals to the light emission control lines EL. However, the present invention is not limited thereto, and the functions of the first driving circuit DC1 and the second driving circuit DC2 may be interchanged. For example, in an exemplary embodiment of the present inventive concept, the first driving circuit DC1 may generate light emission control signals and output the generated light emission control signals to the light emission control lines EL, and the second driving circuit DC2 may generate scan signals and output the generated scan signals to the gate lines GL.

A first power supply voltage and a second power supply voltage may be applied to the pixel PX. The voltage level of the first power supply voltage may be higher than the voltage level of the second power supply voltage. The first power supply voltage may be applied to the pixel PX through the power supply line PL. The power supply line PL may be electrically connected to the first power supply electrode PSE1 to receive the first power supply voltage. The second power supply voltage may be applied to the pixel PX through the second power supply electrode PSE2.

The first power supply electrode PSE1 may include a first electrode unit PSE1a and a plurality of second electrode units PSE1b connected to the first electrode unit PSE1a. The first electrode unit PSE1a is disposed between the display area DA and the pad area PDA, and may be extended along the first direction DR1. Each of the second electrode units PSE1b may be extended from the first electrode unit PSE1a toward the pad area PDA along the second direction DR2. The power supply line PL may be connected to the first electrode unit PSE1a to receive the first power supply voltage.

The second power supply electrode PSE2 is disposed outside of the driving circuits DC, and may have a shape at least partially surrounding a portion of the display area DA. For example, the second power supply electrode PSE2 may be disposed between the first driving circuit DC1 and an edge of the base layer BF. The second power supply electrode PSE2 may transmit the second power supply voltage to the pixel PX. For example, the second power supply electrode PSE2 may supply the second power supply voltage to the pixel PX by means of an electrode included in the pixel PX. This will be described in more detail later in the specification.

The pads PD may be disposed on the pad area PDA. The pad area PDA may be a portion of the non-display area NDA. Each of the pads PD may be electrically connected to the data lines DL, and the driving circuits DC. In addition, the display panel DP may further include a data driving circuit coupled to the pads PD in a chip on film (COF) form. However, the present inventive concept is not limited thereto, and in an exemplary embodiment of the present inventive concept, the data driving circuit may also be integrated into the circuit layer ML. The data driving circuit may be connected to the data lines DL to transmit a data voltage to the data lines DL.

Figure 5A:
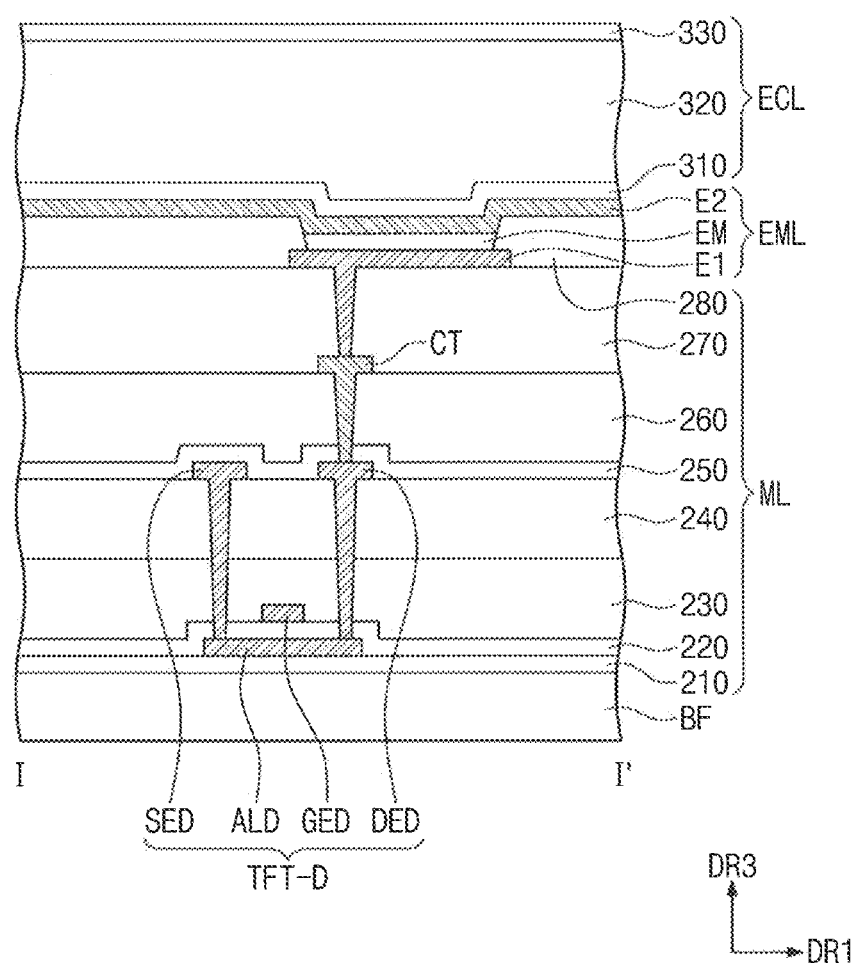
FIG. 5A is a cross-sectional view taken along line I-I' illustrated in FIG. 4 according to an exemplary embodiment of the present inventive concept.
Figure 5B:
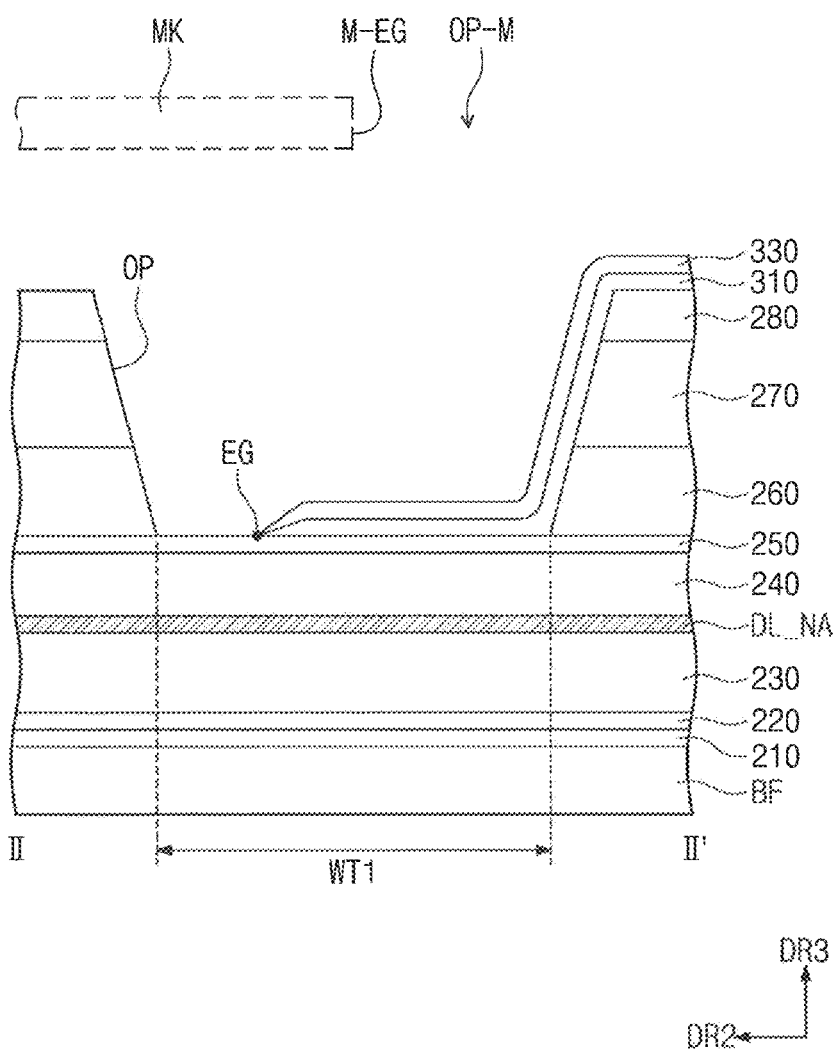
FIG. 5B is a cross-sectional view taken along line I-I' illustrated in FIG. 4 according to an exemplary embodiment of the present inventive concept.

FIG. 5A is a cross-sectional view taken along line I-I' illustrated in FIG. 4 according to an exemplary embodiment of the present inventive concept, and FIG. 5B is a cross-sectional view taken along line I-I' illustrated in FIG. 4 according to an exemplary embodiment of the present inventive concept.

Referring to FIGS. 4, 5A and 5B, a first insulating layer 210 may be disposed on the base layer BF, and a driving transistor TFT-D may be disposed on the first insulating layer 210. The driving transistor TFT-D may include a semiconductor pattern ALD, a control electrode GED, a first electrode SED, and a second electrode DED.

The semiconductor pattern ALD may be disposed on the first insulating layer 210. The first insulating layer 210 may be a buffer layer for providing a modified surface to the semiconductor pattern ALD. In this case, the semiconductor pattern ALD may have higher adhesive force with respect to the first insulating layer 210 than when formed directly on the base layer BF. In addition, the first insulating layer 210 may be a barrier layer for protecting a lower surface of the semiconductor pattern ALD. In this case, the first insulating layer 210 may prevent the base layer BF itself, or dirt or moisture introduced through the base layer BF from permeating into the semiconductor pattern ALD. In addition, the first insulating layer 210 may be a light blocking layer for blocking external light incident through the base layer BF from entering the semiconductor pattern ALD. In this case, the first insulating layer 210 may further include a light shielding material.

A second insulating layer 220 is disposed on the first insulating layer 210, and may cover the semiconductor pattern ALD. For example, the second insulating layer 220 may include an inorganic material. The control electrode GED may be disposed on the second insulating layer 220.

A third insulating layer 230 is disposed on the second insulating layer 220, and may cover the control electrode GED. For example, the third insulating layer 230 may include an inorganic material. The third insulating layer 230 may be the same insulating layer as the first insulating layer 110 (See, e.g., FIG. 3) described above with reference to FIG. 3. A data line DL_NA may be disposed on the third insulating layer 230.

The data lines DL_NA illustrated in FIG. 5B are the data lines DL_NA disposed in the non-display area NDA, and may be electrically connected to the data lines DL disposed in the display area DA (See, e.g., FIG. 4). However, the data lines DL_NA and the data lines DL may be disposed on different layers from each other. The data lines DL_NA may be included in the first conductive layer 120 (See FIG. 3) illustrated in FIG. 3, and the data lines DL may be included in the second conductive layer 140 (See FIG. 3) illustrated in FIG. 3. The data lines DL and the data lines DL_NA may be electrically connected to each other through the second insulating layer 130 (See FIG. 3).

A fourth insulating layer 240 is disposed on the data lines DL_NA, and may cover the data lines DL_NA. For example, the fourth insulating layer 240 may include an inorganic material. The fourth insulating layer 240 may be the same insulating layer as the second insulating layer 130 (See FIG. 3) described above with reference to FIG. 3.

The first electrode SED and the second electrode DED may be disposed on the fourth insulating layer 240. Each of the first electrode SED and the second electrode DED may be connected to the semiconductor pattern ALD through the second insulating layer 220, the third insulating layer 230, and the fourth insulating layer 240.

In addition, the first power supply electrode PSE1 and the second power supply electrode PSE2 may be disposed on the fourth insulating layer 240, and may be provided through the same process as the first electrode SED and the second electrode DED. For example, the first power supply electrode PSE1 and the second power supply electrode PSE2 may include the same material as the first electrode SED and the second electrode DED. The first electrode SED, the second electrode DED, the first power supply electrode PSE1, and the second power supply electrode PSE2 may be included in the second conductive layer 140 (See FIG. 3).

A fifth insulating layer 250 is disposed on the fourth insulating layer 240, and may cover the first power supply electrode PSE1, the second power supply electrode PSE2, the first electrode SED, and the second electrode DED. The fifth insulating layer 250 may be a passivation layer, and may include, for example, an inorganic material. For example, the fifth insulating layer 250 may be formed by depositing an inorganic material. The fifth insulating layer 250 may be the same insulating layer as the third insulating layer 150 (See FIG. 3).

A sixth insulating layer 260 is disposed on the fifth insulating layer 250. The sixth insulating layer 260 may have a laminated structure including an organic film, or an organic film and an inorganic film in a stacked structure. The sixth insulating layer 260 may be a planarization layer for providing a flat surface on an upper portion thereof. The sixth insulating layer 260 may be the same insulating layer as the fourth insulating layer 160 (See FIG. 3).

A third electrode CT may be disposed on the sixth insulating layer 260. The third electrode CT may be connected to the second electrode DED through the fifth insulating layer 250 and the sixth insulating layer 260 by means of a via.

A seventh insulating layer 270 is disposed on the sixth insulating layer 260, and may cover the third electrode CN. The seventh insulating layer 270 may have a laminated structure including an organic film, or an organic film and an inorganic film in a stacked structure. The seventh insulating layer 270 may be a planarization layer for providing a flat surface on an upper portion thereof.

The light emitting element layer EML may be disposed on the seventh insulating layer 270. The light emitting element layer EML may include a first electrode E1, a light emitting layer EM, and a second electrode E2. The first electrode E1 may be disposed on the seventh insulating layer 270, and may be connected to the third electrode CT through the seventh insulating layer 270. The display panel DP according to an exemplary embodiment of the present inventive concept further includes the third electrode CT so that the first electrode E1 may be electrically connected to the driving transistor TFT-D even if the first electrode E1 passes through only the seventh insulating layer 270.

An eighth insulating layer 280 may be disposed on the seventh insulating layer 270. An opening may be provided in the eighth insulating layer 280, and a portion of the first electrode E1 may be exposed by the opening. The light emitting layer EM may be disposed in the opening and on the exposed portion of the first electrode E1. The light emitting layer EM includes a light emitting material, and may generate light when an electrical signal is applied thereto. The eighth insulating layer 280 may be referred to as a pixel defining layer.

The second electrode E2 may be disposed on the light emitting layer EM and the eighth insulating layer 280. The second electrode E2 may be electrically connected to the second power supply electrode PSE2 to receive the second power supply voltage.

A portion of the sixth to eighth insulating layers 260, 270 and 280 may be removed to form an opening OP in the non-display area NDA. The opening OP may surround the display area DA. Air and moisture may permeate into the display area DA through an organic layer including an organic material. In the present exemplary embodiment of the present inventive concept, the opening OP formed in the sixth to eighth insulating layers 260, 270, and 280 including an organic material surrounds the display area DA so that a permeation path of air and moisture heading toward the display area DA may be blocked.

The opening OP may be provided between the display area DA and the pad area PDA and may be divided into a first opening area OPA1 and a second opening area OPA2. For example, the first opening area OPA1 may include a region overlapping the second conductive layer 140 (See FIG. 3) on a plane, and the second opening area OPA2 may include a region not overlapping the second conductive layer 140 on a plane.

Since the second conductive layer 140 includes the first power supply electrode PSE1 and the second power supply electrode PSE2, a portion of the opening OP overlapping the first power supply electrode PSE1 and the second power supply electrode PSE2 is represented by the first opening area OPA1, and a portion not overlapping the first power supply electrode PSE1 and the second power supply electrode PSE2 is represented by the second opening area OPA2.

In the present exemplary embodiment of the present inventive concept, the first opening area OPA1 and the second opening area OPA2 may be arranged along the first direction DR1, and a width WT1 of the first opening area OPA1 in the second direction DR2 crossing the first direction DR1 may be substantially the same as a width WT2 of the second opening area OPA2 in the second direction DR2.

The thin film encapsulating layer ECL may be disposed on the second electrode E2. The thin film encapsulating layer ECL may cover the second electrode E2. For example, the second electrode E2 may be directly covered by the thin film encapsulating layer ECL. In an exemplary embodiment of the present inventive concept, a capping layer for covering the second electrode E2 may be disposed between the thin film encapsulating layer ECL and the second electrode E2. In this case, the thin film encapsulating layer ECL may cover the capping layer.

The thin film encapsulating layer ECL may include a first inorganic layer 310, an organic layer 320, and a second inorganic layer 330 sequentially laminated thereon. For example, the organic layer 320 may be disposed on the first inorganic layer 310 and the second inorganic layer 330 may be disposed on the organic layer 320. The first inorganic layer 310 and the second inorganic layer 330 may be formed by depositing an inorganic material, and the organic layer 320 may be formed by depositing, printing, or coating an organic material.

In FIGS. 5A and 5B, for example, the thin film encapsulating layer ECL includes two inorganic layers and one organic layer, but the present inventive concept is not limited thereto. For example, the thin film encapsulating layer ECL may include three inorganic layers and two organic layers, in which case, the thin film encapsulating layer ECL may have a structure in which the inorganic layers and the organic layers are alternately laminated.

An edge EG of the thin film encapsulating layer ECL disposed between the display area DA and the pad area PDA may be disposed in the opening OP. For example, the edge EG may be directly disposed on an insulating layer including an inorganic material among a plurality of insulating layers. For example, the edge EG of the thin film encapsulating layer ECL may be disposed on the fifth insulating layer 250 including an inorganic material. For example, the edge EG may be directly disposed on the fifth insulating layer 250.

In an exemplary embodiment of the present inventive concept, the thin film encapsulation layer ECL may include a plurality of edges disposed in the non-display area NDA. However, the present inventive concept is not limited thereto.

The edge EG may be an edge of the first inorganic layer 310 and/or the second inorganic layer 330. Each of the first inorganic layer 310 and the second inorganic layer 330 may be formed by disposing a mask MK having a mask opening OP-M on the base layer BF, and depositing an inorganic material through the mask opening OP-M. A deposition process may include, for example, chemical vapor deposition (CVD), physical vapor deposition (PVD), and atomic layer deposition (ALD).

In the process of depositing an inorganic material, a predetermined static electricity may be generated at an edge M-EG of the mask MK forming the mask opening OP-M, and the damage caused by the static electricity may be more severe in an organic layer than in an inorganic layer. According to an exemplary embodiment of the present inventive concept, the edge M-EG of the mask MK is disposed to overlap the opening OP in which not an organic layer but an inorganic layer is exposed, for example, the fifth insulating layer 250. Thus, the damage caused by the static electricity may be reduced, and the reliability of a product may be increased.

Figure 6:
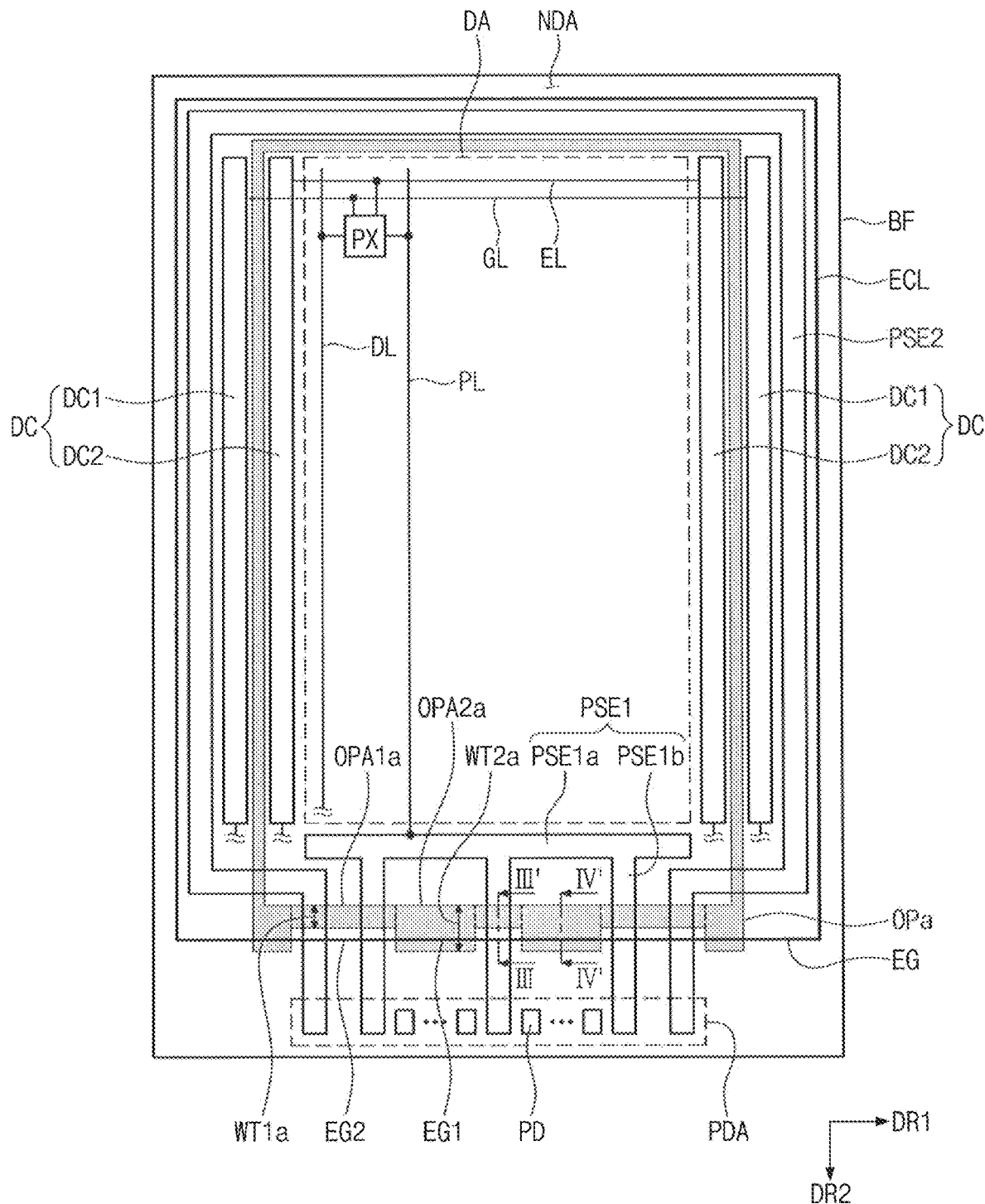
FIG. 6 is a plan view of a display device according to an exemplary embodiment of the present inventive concept.
Figure 7:
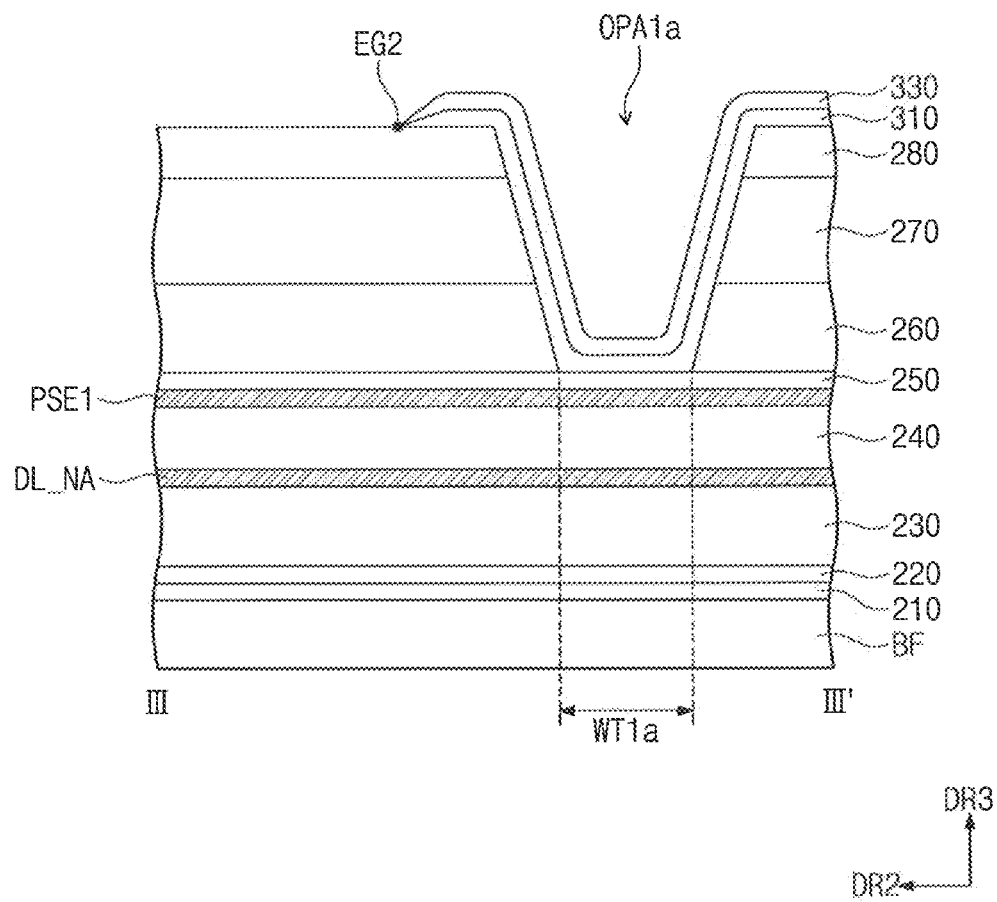
FIG. 7 is a cross-sectional view taken along line III-III' illustrated in FIG. 6 according to an exemplary embodiment of the present inventive concept.
Figure 8:
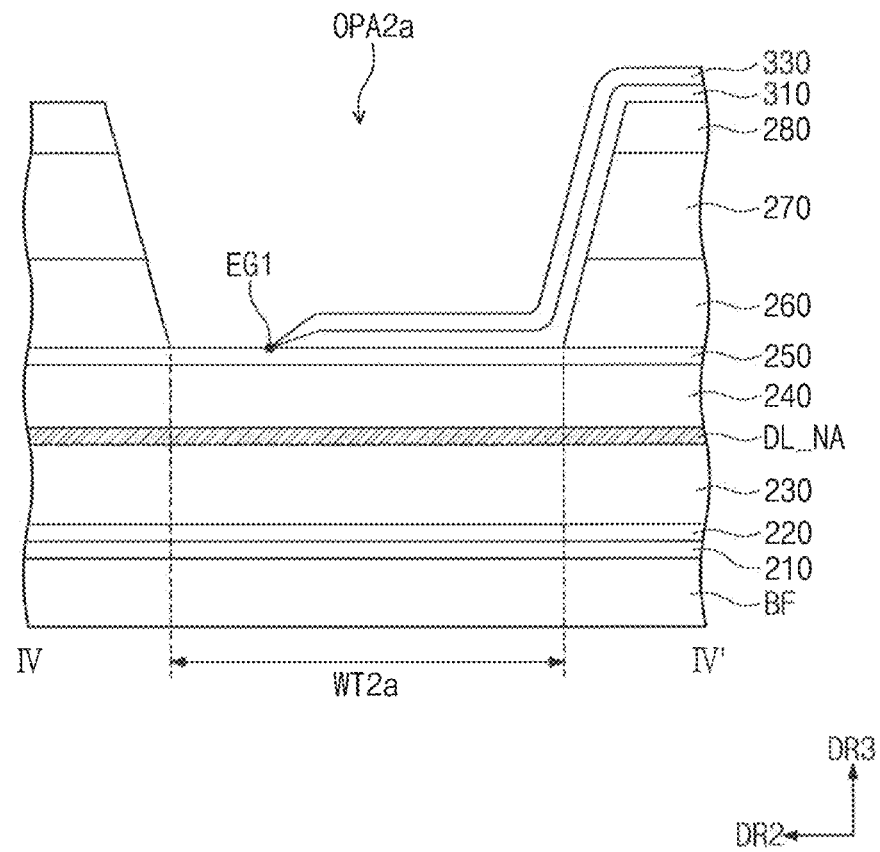
FIG. 8 is a cross-sectional view taken along line IV-IV' illustrated in FIG. 6 according to an exemplary embodiment of the present inventive concept.

FIG. 6 is a plan view of a display device according to an exemplary embodiment of the present inventive concept, FIG. 7 is a cross-sectional view taken along line III-III' illustrated in FIG. 6 according to an exemplary embodiment of the present inventive concept, and FIG. 8 is a cross-sectional view taken along line IV-IV' illustrated in FIG. 6 according to an exemplary embodiment of the present inventive concept. In describing FIGS. 6 to 8, the same reference numerals may be given to the elements in FIGS. 6 to 8 as described in FIGS. 4 and 5, and descriptions of elements that may be assumed to be similar to previously described elements may be omitted.

Referring to FIGS. 6 to 8, an opening OPa provided between the display area DA and the pad area PDA may be divided into a first opening area OPA1a and a second opening area OPA2a. The first opening area OPA1a may be an area including an area overlapping the first power source electrode PSE1 and the second power source electrode PSE2, and the second opening area OPA2a may be an area including an area not overlapping the first power source electrode PSE1 and the second power source electrode PSE2.

In the present exemplary embodiment of the present inventive concept, the first opening area OPA1a and the second opening area OPA2a are arranged along the first direction DR1, and a width WT1a of the first opening area OPA1a in the second direction DR2 may be smaller than a width WT2a of the second opening area OPA2a in the second direction DR2.

The edge EG of the thin film encapsulating layer ECL may be divided into a first edge EG1 and a second edge EG2. The first edge EG1 may be disposed in the second opening area OPA2a. The second edge EG2 may be as a remaining portion of the edge EG excluding the first edge EG1. In FIG. 6, only the first edge EG1 overlaps the opening OPa on a plane, and the second edge EG2 might not overlap the opening OPa. For example, the second edge EG2 may be disposed on the eighth insulating layer 280.

The fifth to eighth insulating layers 250, 260, 270, and 280 may be disposed between the second edge EG2 and the second conductive layer 140 (See FIG. 3) including the first and second power supply electrodes PSE1 and PSE2. For example, the fifth to eighth insulating layers 250, 260, 270 and 280 are disposed between the second edge EG2 and the first power source electrode PSE1.

In the first opening area OPA1a, the first power source electrode PSE1 is disposed below the fifth insulating layer 250. Since the fifth insulating layer 250 is relatively thin, when an edge of a mask is positioned in the first opening area OPA1a, micro cracks may be generated in the first power source electrode PSE1 (for example, the second conductive layer 140 (See FIG. 3) including the first power source electrode PSE1) due to an arching phenomenon. In a conductive layer in which micro cracks are generated, corrosion caused by micro cracks may occur in a reliability evaluation step.

According to an exemplary embodiment of the present inventive concept, to prevent the above-mentioned problem, an edge of a mask may be disposed to not overlap the first opening area OPA1a. For example, the edge of the mask may overlap the eighth insulating layer 280. In this case, micro cracks may be prevented from being generated in the first power supply electrode PSE1 due to an arching phenomenon. For example, since an edge of a mask is disposed to not overlap the first opening area OPA1a, the second edge EG2 of the thin film encapsulating layer ECL might not overlap the first opening area OPA1a. As an additional example, the first edge EG1 may overlap the second opening OPA2a.

Figure 9:
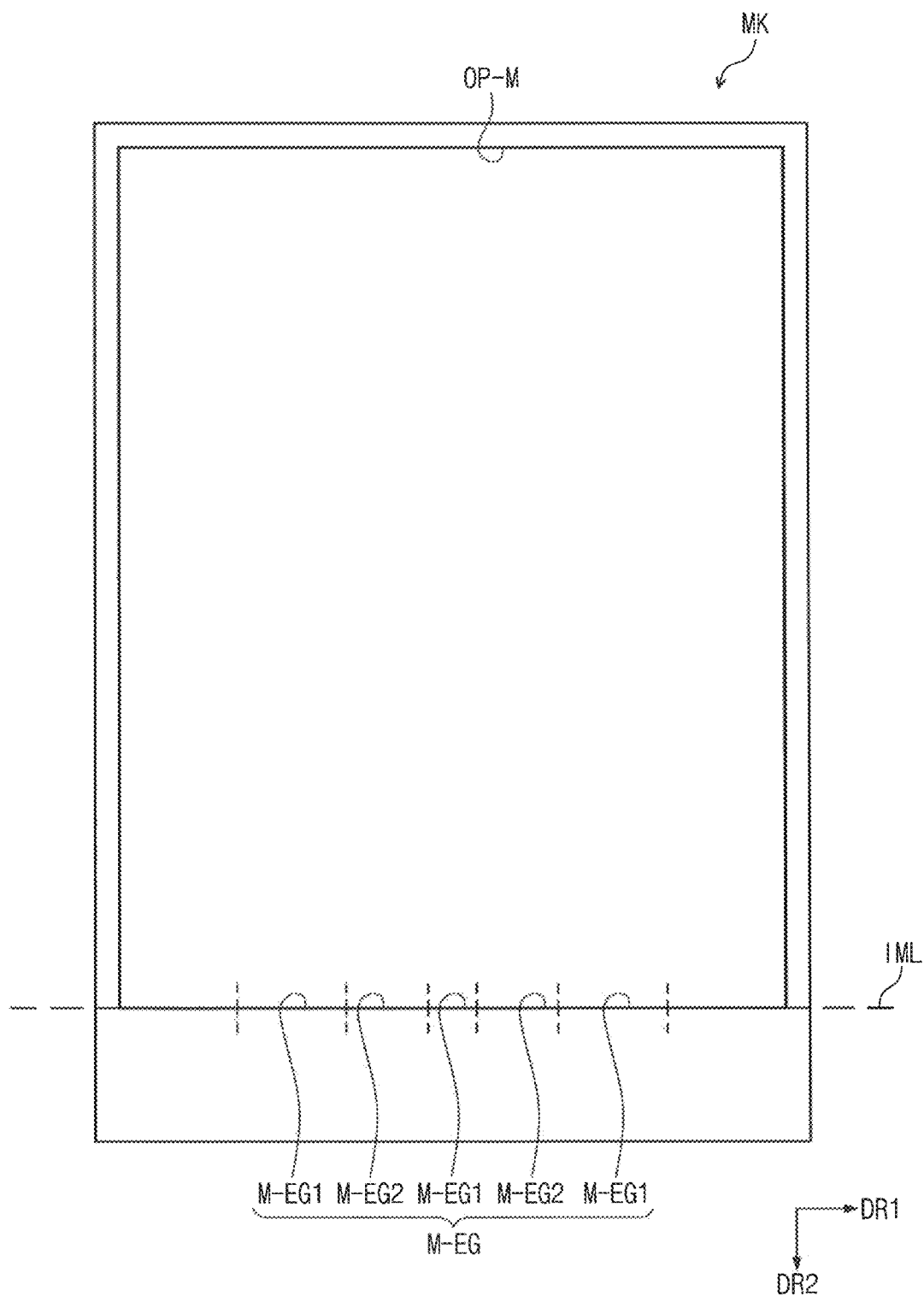
FIG. 9 is a plan view of a mask according to an exemplary embodiment of the present inventive concept.

FIG. 9 is a plan view of a mask according to an exemplary embodiment of the present inventive concept. The mask MK of FIG. 9 may be used for forming the thin film encapsulating layer ECL illustrated in FIGS. 4 and 6.

Referring to FIGS. 5B and 9, the mask MK may be used for forming the first inorganic layer 310 and the second inorganic layer 330. The mask opening OP-M is provided on the mask MK. The edge of the mask M-EG, which is disposed between the display area DA (See FIG. 4) and the pad area PDA (See FIG. 4) among the edges of the mask opening OP-M, may include a first mask edge M-EG1 and a second mask edge M-EG2. The first mask edge M-EG1 and the second mask edge M-EG2 may be disposed on an imaginary line IML extending in the first direction DR1.

Referring to FIGS. 4 and 9, the mask may form the thin film encapsulating layer ECL such that the first mask edge M-EG1 and the second mask edge M-EG2 are disposed to overlap the opening OP. Since the edge M-EG of the mask MK of FIG. 9 is disposed on the same imaginary line IML, the edge EG of the thin film encapsulating layer ECL formed by the mask MK may have a linear shape on a plane. For example, in FIG. 4, a distance LT2 between the edge EG of the thin film encapsulating layer ECL disposed in the first opening area OPA1 and the display area DA may be substantially the same as a distance LT1 between the edge EG of the thin film encapsulating layer ECL disposed in the second opening area OPA2 and the display area DA.

Referring to FIGS. 4, 5A, 5B, and 9, a method of manufacturing a display device will be described.

The base layer BF on which the display area DA, the non-display area NDA, and the pad area PD are disposed. The circuit layer ML including a plurality of insulating layers and a plurality of conductive layers is formed on the base layer BF. The light emitting element layer EML is formed on the circuit layer ML.

The mask MK having the mask opening OP-M is disposed on the light emitting element layer EML. At this time, the opening OP for exposing an insulating layer (for example, the fifth insulating layer 250) disposed between the display area DA and the pad area PDA and including an inorganic material among the plurality of insulating layers is formed, and the mask MK may be disposed such that the mask edge M-EG and the mask opening OP-M may overlap the opening OP on a plane.

The first inorganic layer 310 of the thin film encapsulating layer ECL is formed using the mask MK. In the process of depositing an inorganic material, a predetermined static electricity may be generated at the mask edge M-EG, and the damage caused by the static electricity may be more severe in an organic layer than in an inorganic layer. According to an exemplary embodiment of the present inventive concept, the mask edge M-EG is disposed so as to overlap the opening OP in which not an organic layer but an inorganic layer is exposed. Thus, the damage caused by the static electricity may be reduced, and as a result, the reliability of a product may be increased. Thereafter, the organic layer 320 is formed on the first inorganic layer 310, and the second inorganic layer 330 is formed on the organic layer 320. The second inorganic layer 330 may be formed using the same mask MK as used for the first inorganic layer 310.

Referring to FIGS. 6 and 9, the opening OPa is provided such that the first width WT1a of the first opening area OPA1a in the second direction DR2 is narrower (e.g., less) than the width WT2a of the second opening area OPA2a in the second direction DR2. Thus, the thin film encapsulating layer ECL may be formed in a state in which the first mask edge M-EG1 of the mask MK is disposed to not overlap the first opening area OPA1a, and the second mask edge M-EG2 is disposed to overlap the second opening area OPA2a. Thus, micro cracks may be prevented from being generated in the first power supply electrode PSE1 and the second power supply electrode PSE2 due to an arching phenomenon.

Figure 10:
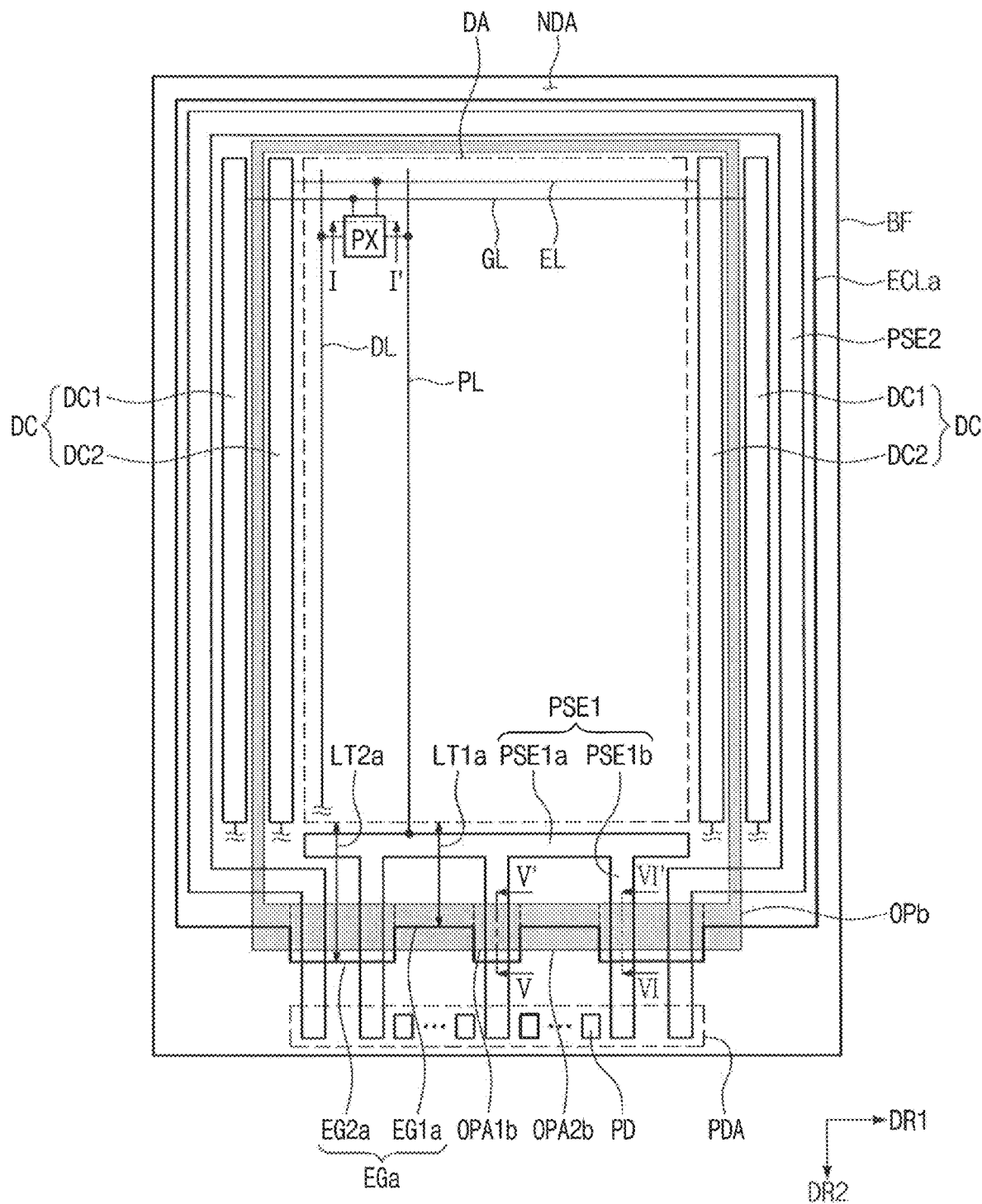
FIG. 10 is a plan view of a display panel according to an exemplary embodiment of the present inventive concept.
Figure 11:
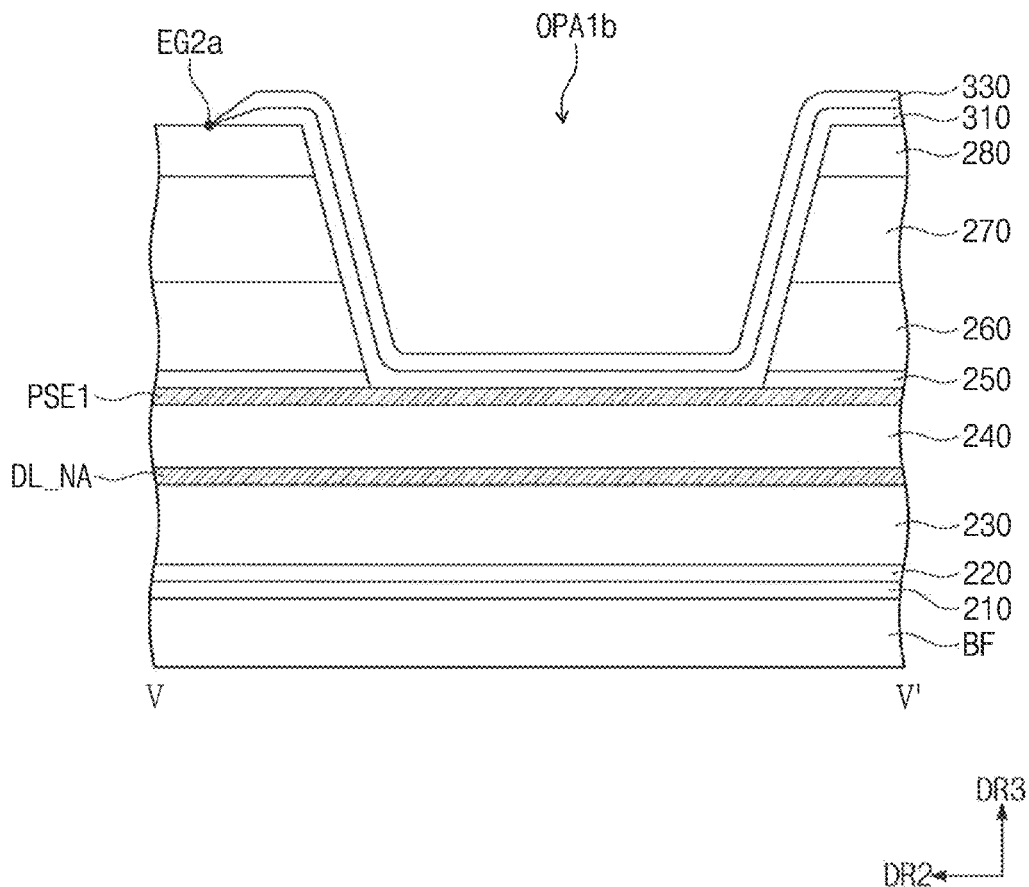
FIG. 11 is a cross-sectional view taken along line V-V' illustrated in FIG. 10 according to an exemplary embodiment of the present inventive concept.
Figure 12:
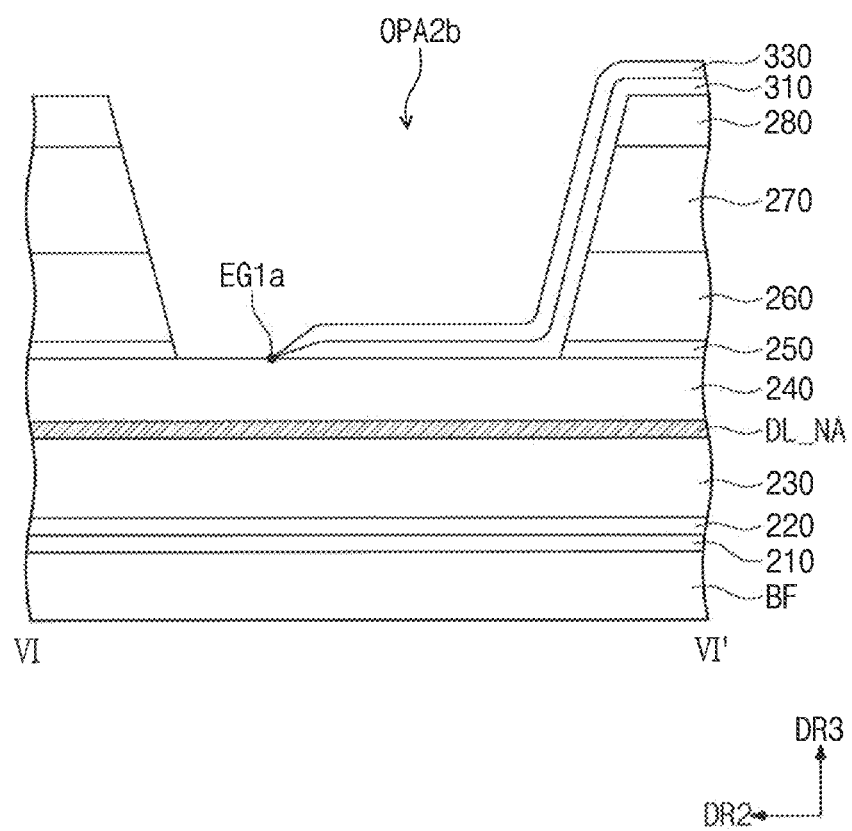
FIG. 12 is a cross-sectional view taken along line VI-VI' illustrated in FIG. 10 according to an exemplary embodiment of the present inventive concept.

FIG. 10 is a plan view of a display panel according to an exemplary embodiment of the present inventive concept, FIG. 11 is a cross-sectional view taken along line V-V' illustrated in FIG. 10 according to an exemplary embodiment of the present inventive concept, and FIG. 12 is a cross-sectional view taken along line VI-VI' illustrated in FIG. 10 according to an exemplary embodiment of the present inventive concept. In describing FIGS. 10 to 12, the same reference numerals may be given to the elements in FIGS. 6 to 8 as described in FIGS. 4, 5A, and 5B, and descriptions of elements that may be assumed to be similar to previously described elements may be omitted.

Referring to FIGS. 10, 11, and 12, an opening OPb may be formed in the non-display area NDA by removing a portion of the fifth to eighth insulating layers 250, 260, 270 and 280. When compared with FIG. 4, a portion of the fifth insulating layer 250 is also removed to form the opening OPb. Thus, the second conductive layer 140 (See FIG. 3) or the fourth insulating layer 240 disposed below the fifth insulating layer 250 may be exposed by the opening OPb. In FIG. 11, the first power supply electrode PSE1 is exposed by the opening OPb, and in FIG. 12, the fourth insulating layer 240 is exposed by the opening OPb.

The opening OPb provided between the display area DA and the pad area PDA may be divided into a first opening area OPA1b and a second opening area OPA2b. The first opening area OPA1b may be a region overlapping the second conductive layer 140 (See FIG. 3) on a plane, and the second opening area OPA2b may be a region not overlapping the second conductive layer 140 (See FIG. 3) on a plane. For example, the second conductive layer 140 may be exposed in the first opening area OPA1b, and the fourth insulating layer 240 may be exposed in the second opening area OPA2b.

In the present exemplary embodiment of the present invention, the first opening area OPA1b and the second opening area OPA2b may be arranged along the first direction DR1, and a width of the first opening area OPA1b in the second direction DR2 may be substantially the same as a width of the second opening area OPA2b in the second direction DR2.

An edge EGa of a thin film encapsulating layer ECLa may be disposed between the display area DA and the pad area PDA. The edge EGa of the thin film encapsulating layer ECLa may be divided into a first edge EG1a and a second edge EG2a. The first edge EG a may overlap the second opening area OPA2b, and the second edge EG2a might not overlap the first opening area OPA1b. For example, the first edge EG1a may be disposed on the fourth insulating layer 240 and the second edge EG2a may be disposed on the eighth insulating layer 280.

The first edge EG1a may be disposed on an insulating layer including an inorganic material among the plurality of insulating layers. For example, the first edge EG1a may be disposed directly on the insulating layer. As an additional example, the first edge EG1a of the thin film encapsulating layer ECLa may be directly disposed on the fourth insulating layer 240 including an inorganic material.

The fifth to eighth insulating layers 250, 260, 270, and 280 may be disposed between the second edge EG2a and the second conductive layer 140 (See FIG. 3) including the first and second power supply electrodes PSE1 and PSE2. For example, the fifth to eighth insulating layers 250, 260, 270 and 280 may be disposed between the second edge EG2a and the first power supply electrode PSE1.

Figure 13:
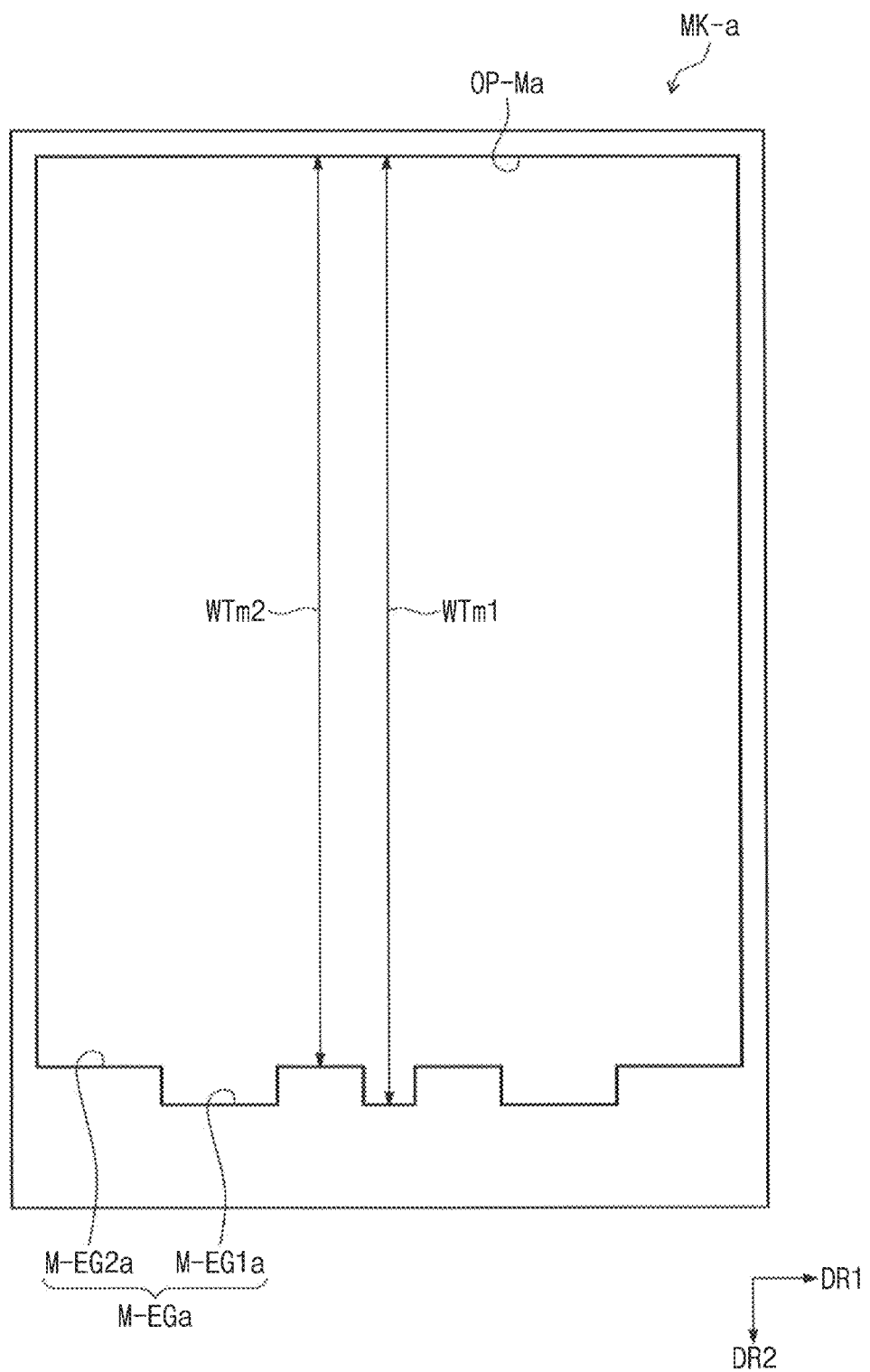
FIG. 13 is a plan view of a mask according to an exemplary embodiment of the present inventive concept.

FIG. 13 is a plan view of a mask according to an exemplary embodiment of the present inventive concept. FIG. 13 is a plan view of a mask MK-a used for forming the thin film encapsulating layer ECLa illustrated in FIG. 10.

Referring to FIGS. 10 to 13, the mask MK-a may be used for forming the first inorganic layer 310 and the second inorganic layer 330. A mask opening OP-Ma is provided on the mask MK-a. A mask edge M-EGa, which is disposed between the display area DA and the pad area PDA among the edges of the mask opening OP-Ma, may include a first mask edge M-EG1a and a second mask edge M-EG2a.

A width WTm1 of the mask opening OP-Ma extending to the first mask edge M-EG1a in the second direction DR2 may be greater than a width WTm2 of the mask opening OP-Ma extending to the second mask edge M-EG2a in the second direction DR2. For example, the width WTm1 may be from a back edge of the mask opening OP-Ma to the first mask edge M-EG1a in the second direction DR2. Thus, the first inorganic layer 310 and the second inorganic layer 330 of the thin film encapsulating layer ECL may be formed in a state in which the first mask edge M-EG1*a* does not overlap the first opening area OPA1*b*, and the second mask edge M-EG2*a* overlaps the second opening area OPA2*b*.

In the process of depositing an inorganic material, a predetermined static electricity may be generated at an edge of a mask providing an opening of the mask, and the damage caused by the static electricity may be more severe in an organic layer than in an inorganic layer. According to an exemplary embodiment of the present inventive concept, an edge of a mask may be disposed to overlap an opening in which not an organic layer but an inorganic layer is exposed. Thus, the damage caused by the static electricity may be reduced, and as a result, the reliability of a product may be increased. In addition, some of the edges of the mask may be disposed to overlap the organic layer to prevent micro cracks from being generated in a conductive layer due to an arching phenomenon.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A display device comprising:
   a base layer including a display area, a non-display area, and a pad area;
   a circuit layer disposed on the base layer and including a plurality of insulating layers and a plurality of conductive layers;
   a light emitting element layer disposed on the circuit layer; and
   a thin film encapsulating layer disposed on the light emitting element layer, wherein an edge of the thin film encapsulating layer disposed between the display area and the pad area includes a first edge and a second edge, and the first edge is disposed on an insulating layer among the plurality of insulating layers, wherein the insulating layer includes an inorganic material, wherein the circuit layer comprises a first insulating layer disposed on the base layer, a first conductive layer disposed on the first insulating layer, a second insulating layer disposed on the first conductive layer, a second conductive layer disposed on the second insulating layer, a third insulating layer disposed on the second conductive layer and including the inorganic material, and a fourth insulating layer disposed on the third insulating layer and including an organic material, and an opening, wherein the opening exposes the third insulating layer, and the first edge is disposed on the third insulating layer and overlaps the opening.

2. The display device of claim 1, wherein the comprises a first opening area overlapping the second conductive layer, and a second opening area overlapping an area, adjacent the second conductive layer, wherein the first edge is disposed in the second opening area.

3. The display device of claim 2, wherein the second edge is disposed in the first opening area, and is disposed on the third insulating layer.

4. The display device of claim 2, wherein between the second edge and the second conductive layer, the third insulating layer and the fourth insulating layer are disposed.

5. The display device of claim 2, wherein the first opening area and the second opening area are arranged along a first direction, and a first width of the first opening area in a second direction crossing the first direction is smaller than a second width of the second opening area in the second direction.

6. The display device of claim 2, wherein the first opening area and the second opening area are arranged along a first direction, and a first width of the first opening area in a second direction crossing the first direction is the same as a second width of the second, opening area in the second direction.

7. The display device of claim 2, wherein a distance between the first edge and the display area is substantially the same as a distance between the second edge and the display area in a plane view.

8. The display device of claim 2, wherein a distance between the second edge and the display area is greater than a distance between the first edge and the display area in a plane view.

9. The display device of claim 1, wherein the second conductive layer comprises a first power supply electrode for providing a first power supply voltage, and a second power supply electrode for providing a second power supply voltage different from the first power supply voltage.

10. The display device of claim 1, wherein the thin film encapsulating layer comprises at least one organic layer, a first inorganic layer and a second inorganic layer, wherein the organic layer is disposed between the first and second inorganic layers, and the edge of the film encapsulating layer is an edge of the first and second inorganic layers.

* * * * *